United States Patent [19]
Roberts

[11] Patent Number: 5,286,969
[45] Date of Patent: Feb. 15, 1994

[54] APPARATUS FOR MEASURING OPTICAL POWER IN AN OPTICAL RECEIVER WITH A NON-LINEAR ELEMENT AND A TRANSCONDUCTANCE AMPLIFIER

[75] Inventor: James G. Roberts, Soest, Netherlands

[73] Assignee: AT&T Bell Laboratories, Murray Hill, N.J.

[21] Appl. No.: 10,376

[22] Filed: Jan. 28, 1993

[51] Int. Cl.$^5$ .............................................. H01J 40/14
[52] U.S. Cl. ........................... 250/214 A; 250/214 C; 330/110; 307/492
[58] Field of Search ........ 250/214 A, 214 C, 214 LA, 250/214 AG, 214 RC; 330/110, 85; 307/492, 362, 311

[56] References Cited

U.S. PATENT DOCUMENTS

| | | | |
|---|---|---|---|
| 3,584,232 | 6/1971 | Wallace, Jr. | 307/492 |
| 3,992,622 | 11/1976 | Numata et al. | 307/492 |
| 4,009,385 | 2/1977 | Sell . | |
| 5,132,829 | 7/1992 | Tzeng | 359/187 |

*Primary Examiner*—David C. Nelms
*Assistant Examiner*—Que T. Le
*Attorney, Agent, or Firm*—Scott W. McLellan

[57] ABSTRACT

An optical power monitoring circuit in an optical data receiver. A transconductance amplifier with non-linear feedback converts averaged photodiode current into a voltage representing a logarithm of the received optical power, which may be converted into decibels referenced to a standard power (dBm). The circuit has wide dynamic range and uses matched devices to provide processing and temperature compensation.

11 Claims, 1 Drawing Sheet

APPARATUS FOR MEASURING OPTICAL POWER IN AN OPTICAL RECEIVER WITH A NON-LINEAR ELEMENT AND A TRANSCONDUCTANCE AMPLIFIER

FIELD OF THE INVENTION

This invention relates generally to optical receivers and, more particularly, to monitoring circuits for measuring the received optical power in the receiver.

BACKGROUND OF THE INVENTION

As is well known, the error rate in decoding a received digital signal is inversely proportional to the strength of the received signal: the weaker the signal, the more likely an incorrect decision will be made on whether the received signal is a "one" or a "zero". It is advantageous, therefore, to be able to monitor received signal strength (power) in a given communications channel so that the performance "health" of the channel can be readily ascertained and any problems fixed before the channel fails.

In optical communication systems, the received signal strength is the amount of optical power received at an optical-to-electrical converter or receiver, such as a PIN photodiode. One convenient way of measuring the average optical power received by a PIN photodiode is to monitor the average current (bias current) through the diode. However, due to the substantial range in optical signal power that a PIN photodiode can handle, the range in bias current can exceed the dynamic range of a monitoring circuit. Further, to adapt the monitoring circuit to tolerate the large range in PIN bias current, with the low voltage power supplies used today (typically +5 volts), the lower the headroom (the voltage drop across the diode) available to the PIN diode, thus, under high signal levels, the PIN diode may saturate, causing the system to be inoperable.

Thus, a need exists for received optical power monitoring circuit that can operate over wide power levels with low supply voltage without substantially reducing the headroom available to the optical receiver at high optical signal levels.

SUMMARY OF THE INVENTION

An apparatus for measuring optical power received by a photodiode, characterized by a transconductance amplifier, having an inverting input and an output, and a non-linear element coupling between the inverting input and output of the amplifier. The photodiode is coupled to the inverting input of the amplifier. The output of the amplifier has a voltage thereon that is proportional to the log of the received optical power.

BRIEF DESCRIPTION OF THE DRAWING

The foregoing features of this invention, as well as the invention itself, may be more fully understood from the following detailed description of the drawings, in which:

The figure is a simplified schematic diagram of a optical receiver having a PIN photodiode and a received optical power monitor, according to one embodiment of the invention.

DETAILED DESCRIPTION

Figure 1:
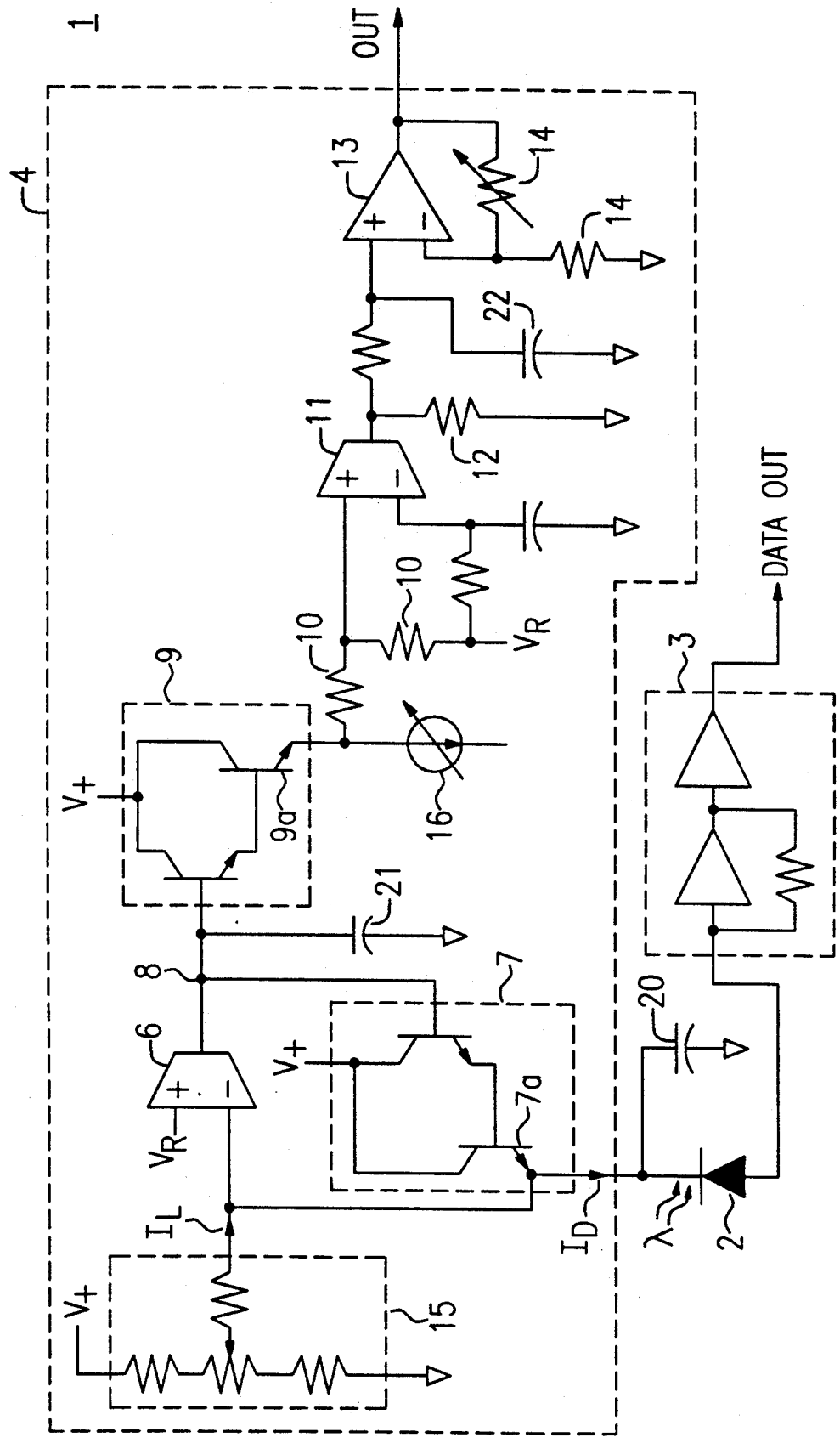

In the figure an optical receiver 1 is diagramed having a PIN photodiode 2, signal amplifier 3, and optical power monitor 4. The output of the optical power monitor 4 (OUT) is a low frequency signal corresponding to the logarithm of the received optical power. The output may be calibrated into decibels referred to a standard power level (e.g., dBm), as will be discussed below. In summary, the optical power monitor 4 has transconductance amplifier 6 with a darlington pair 7, as a non-linear element, to feed back the output of amplifier 6 to the inverting input of the amplifier 6. The emitter of the darlington pair 7, coupling to the inverting input of amplifier 6, also couples to the photodiode 2 to provide bias current ($I_D$) to the PIN photodiode 2. Thus, the voltage on node 8 is proportional to the logarithm of the optical power received by photodiode 2.

In more detail, an applied optical signal (not shown) received by photodiode 2 has two components: a data portion (time varying, typically high frequency) and an average (low frequency) portion, representative of the power received by the photodiode 2. The signal amplifier 3, typically including a transimpedance amplifier, amplifies the data signal portion for further processing, such as a clock extraction and data decision. Power monitor 4 measures the average portion of the received signal to provide an output (OUT) corresponding to the logarithm of the received optical power, typically measured in decibels. The output signal may then be digitized by an analog-to-digital converter (not shown) for further processing and/or coupled to a threshold detector (not shown) for providing a loss-of-signal alarm.

As discussed above, darlington-connected transistor pair 7 acts as a non-linear feedback for transconductance operational amplifier 6 and supplies bias (operating) current $I_D$ to photodiode 2. The darlington pair 7 operates as a square-law device such that the current through photodiode 2 is transformed to a voltage on node 8 (the output of amplifier 6) which is proportional to the logarithm of the current $I_D$. Thus, the voltage on node 8 is proportional to the logarithm of the power of the received optical signal incident on photodiode 2. Advantageously and in accordance with the present invention, because the voltage on node 8 is a logarithm of the current through the photodiode 2, only a small change in voltage occurs for a large change in photodiode current. The reduction in voltage change thus limits the amount of change in voltage (headroom) for the photodiode 2 with large changes in optical signal power so that the receiver 1 can handle a wide range in optical signal power levels.

A second darlington connected transistor pair 9 provides compensation for temperature variations and processing variations affecting darlington pair 7 in the closed-loop combination of the pair 7 and amplifier 6. Preferably, the darlington pairs 7 and 9 are combined in a common chip. To get the desired compensation, corresponding transistors in each pair 7, 9 (e.g., 7a, 9a), are matched devices which substantially equal currents therein or, alternatively, are sized to have substantially equal current densities.

Voltage divider 10 reduces the voltage from the second darlington pair 9 to avoid saturating a second transconductance operational amplifier 11. Output current from transconductance amplifier 11 is converted into a voltage by resistor 12, and amplified by operational amplifier 13. Resistors 14 set the gain of the amplifier 13 for calibration, as will be discussed below.

Circuit 15 provides a current $I_L$ (typically 1 $\mu A$) to compensate for leakage current through photodiode 2 when no optical signal is being received. It is understood that circuit 15 may be adapted to provide an $I_L$ that varies with photodiode temperature since the leakage current may be proportional with diode temperature.

Variable current source 16 allows for "zeroing", or setting to a predetermined voltage, the output OUT at a predetermined received optical power level. By adjusting the current from current source 16 and setting the gain of amplifier 13 by adjusting resistors 14, the voltage on the output OUT will be directly related to the received optical power, e.g., 0 volts represents a minimum acceptable power level ($-35$ dBm) and 2.5 volts represents a maximum acceptable power level ($-15$ dBm), a 100:1 variation in power levels.

Capacitor 20 bypasses photodiode 2 for high-frequency signals (data) while passing to monitor 4 a low frequency (near DC) signal representing the average received optical power. Similarly, capacitors 21, 22 remove high frequency signals and noise within the monitor 4.

Preferably, the amplifier 6, 11 and transistors 7, 9 are formed in a common integrated circuit, such as an LM13600, manufactured by National Semiconductor of Santa Clara, Calif. Amplifier 13 may be a conventional operational amplifier. Exemplary transconductance of amplifiers 7, 11 are each 30 μmhos. A fixed reference voltage, $V_R$, is approximately 2.5 volts in this example.

Other photodetectors 2 may be used other than a PIN, photodiode, such as conventional PN junction photodiodes.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. An apparatus for monitoring the power of an optical signal received by a photodiode in an optical receiver, CHARACTERIZED BY:
   a first transconductance amplifier having an inverting input and an output;
   a first non-linear element, coupling between the inverting input and the output of the transconductance amplifier;
   wherein the photodiode couples to the inverting input of the amplifier and the output of the amplifier provides a voltage that is proportional to the logarithm of the received optical signal power.

2. The apparatus as recited in claim 1, further characterized by a second non-linear element, coupling to the output of the amplifier, for proving compensation for variations in the first non-linear element.

3. The apparatus as recited in claim 2, wherein the non-linear elements are square-law devices.

4. The apparatus as recited in claim 3, wherein the photodiode is a PIN photodiode.

5. The apparatus as recited in claim 2, further characterized by:
   a second transconductance amplifier having an output and an input, the input coupling to the second non-linear element;
   a variable current source, coupling to the input of the second transconductance amplifier, for setting the output of the second amplifier to a desired level when a predetermined optical power is received.

6. The apparatus as recited in claim 5, wherein each of the square-law devices are darlington-connected bipolar transistor pairs with corresponding transistors of the pairs being matched.

7. The apparatus as recited in claim 1, further characterized by a circuit means, coupling to the inventing input of the first amplifier, for providing a current to compensate for leakage through the photodiode.

8. The apparatus as received in claim 7, wherein each of the square-law devices are darlington-connected bipolar transistor pairs with corresponding transistors of the pairs being matched.

9. An apparatus for monitoring the power of an optical signal received by a photodiode in an optical receiver, CHARACTERIZED BY:
   a first transconductance amplifier having an inverting input and an output;
   a first square-law device, coupling between the inverting input and the output of the transconductance amplifier;
   a second square-law device, coupling to the output of the first amplifier, for providing compensation for variations in the first square-law device;
   a second transconductance amplifier having an output and an input, the input coupling in series with the second square-law device to the output of the first transconductance amplifier;
   a variable current source, coupling to the input of the second transconductance amplifier, for setting the output of the second transconductance amplifier to a desired level when a predetermined optical power is received;
   wherein the photodiode couples to the inverting input of the first amplifier and the output of the amplifier provides a voltage that is proportional to the logarithm of the received optical signal power.

10. The apparatus as received in claim 9, further characterized by a circuit means, coupling to the inverting input of the first amplifier, for providing a current to compensate for leakage through the photodiode.

11. The apparatus as received in claim 10, wherein each of the square-law devices are darlington-connected bipolar transistor pairs with corresponding transistors of the pairs are matched.

* * * * *

UNITED STATES PATENT AND TRADEMARK OFFICE
CERTIFICATE OF CORRECTION

PATENT NO.  : 5,286,969

DATED       : February 15, 1994

INVENTOR(S) : James Gregory Roberts

It is certified that error appears in the above-identified patent and that said Letters Patent is hereby corrected as shown below:

TITLE PAGE, ASSIGNEE

At [73], page 1, "AT&T Bell Laboratories, Murray Hill, N.J." should read --AT&T Network Systems International B. V., Hilversum, The Netherlands--.

Signed and Sealed this

Twenty-first Day of June, 1994

Attest:

BRUCE LEHMAN

Attesting Officer         Commissioner of Patents and Trademarks